(12) United States Patent
Shin et al.

(10) Patent No.: US 7,855,926 B2
(45) Date of Patent: Dec. 21, 2010

(54) SEMICONDUCTOR MEMORY DEVICE HAVING LOCAL SENSE AMPLIFIER WITH ON/OFF CONTROL

(75) Inventors: Sang-Woong Shin, Gyeonggi-do (KR); Chul-Soo Kim, Gyeonggi-do (KR); Young-Hyun Jun, Seoul (KR); Sang-Bo Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 23 days.

(21) Appl. No.: 11/188,184

(22) Filed: Jul. 20, 2005

(65) Prior Publication Data

US 2006/0028888 A1 Feb. 9, 2006

(30) Foreign Application Priority Data

Aug. 3, 2004 (KR) .................. 10-2004-0061090

(51) Int. Cl.
*G11C 7/00* (2006.01)
*G11C 7/02* (2006.01)

(52) U.S. Cl. .............. 365/190; 365/196; 365/203; 365/205; 365/207; 365/208

(58) Field of Classification Search .......... 365/205, 365/207, 208, 203, 238.5, 63, 196, 190, 194
See application file for complete search history.

(56) References Cited

U.S. PATENT DOCUMENTS 4,586,166 A * 4/1986 Shah .................. 365/207
5,412,607 A * 5/1995 Kusaba ................ 365/205
6,111,796 A 8/2000 Chang et al.

(Continued)

FOREIGN PATENT DOCUMENTS

KR 2001-84782 9/2001

OTHER PUBLICATIONS

English language abstract of the Korean Publication No. 2001-84782.

(Continued)

*Primary Examiner*—Trong Phan
(74) *Attorney, Agent, or Firm*—Muir Patent Consulting, PLLC

(57) ABSTRACT

A semiconductor memory device includes a plurality of memory cell array blocks, a bit line sense amplifier, a local sense amplifier that can be controlled to be turned on or off, a data sense amplifier, and a controller. The controller activates a local sense control signal for a predetermined duration in response to first and second signals. The first signal is a bit line sense enable signal that activates the bit line sense amplifier, and the local sense amplifier is activated for a predetermined duration after the bit line sense enable signal is activated. The second signal is activated or deactivated in phase with a column selection line signal that connects a pair of bit lines and a pair of local input/output lines. Accordingly, it is possible to turn on or off the local sense amplifier according to operating conditions, thereby increasing a tRCD parameter and reducing the consumption of current. The operating speed of the semiconductor memory device can be improved by combining the local sense amplifier with a current type data sense amplifier that does not require precharging and equalization during a read operation.

33 Claims, 10 Drawing Sheets

U.S. PATENT DOCUMENTS

| | | | |
|---|---|---|---|
| 6,285,612 B1 * | 9/2001 | DeBrosse | 365/205 |
| 6,611,446 B2 * | 8/2003 | Kawasumi | 365/63 |
| 6,816,416 B2 * | 11/2004 | Won | 365/203 |
| 6,859,409 B2 * | 2/2005 | Hwang | 365/196 |
| 6,868,034 B2 * | 3/2005 | La et al. | 365/238.5 |
| 6,930,939 B2 * | 8/2005 | Lim et al. | 365/203 |
| 6,930,941 B2 * | 8/2005 | Nakase | 365/205 |
| 6,985,394 B2 * | 1/2006 | Kim | 365/203 |
| 7,002,858 B2 * | 2/2006 | Lee | 365/207 |
| 2002/0071302 A1 | 6/2002 | Kawasumi | |
| 2004/0037140 A1 | 2/2004 | Kang | |
| 2004/0052140 A1 * | 3/2004 | Chae et al. | |
| 2004/0085841 A1 * | 5/2004 | Lim et al. | |
| 2004/0130926 A1 | 7/2004 | Nakase | |

OTHER PUBLICATIONS

Changsik Yoo, et al., "A 1.8-V 700-Mb/s/pin 512-Mb DDR-II SDRAM with On-Die Termination and Off-Chip Driver Calibration" IEEE Journal of solid-state circuits, vol. 39, No. 6, Jun. 2004. pp. 941-951.

* cited by examiner

SEMICONDUCTOR MEMORY DEVICE HAVING LOCAL SENSE AMPLIFIER WITH ON/OFF CONTROL

CROSS-REFERENCE TO RELATED PATENT APPLICATIONS

This application claims the priority of Korean Patent Application No. 10-2004-0061090, filed on Aug. 3, 2004, in the Korean Intellectual Property Office, the disclosure of which is incorporated herein in its entirety by reference.

BACKGROUND OF THE INVENTION

1. Field of the Invention

The present invention relates to a semiconductor memory device, and more particularly, to a semiconductor memory device with a local sense amplifier that can be turned on only if required.

2. Description of the Related Art

In a semiconductor memory device such as a dynamic random access memory (DRAM) or a synchronous random access memory (SRAM), data read in a read operation sequentially passes through a plurality of sense amplifiers and is then output. Since data read from a memory cell has a low voltage, the voltage of the data is amplified by a bit line sense amplifier. The amplified voltage of the data is amplified again by a data sense amplifier, and then the data is output. FIG. 1 illustrates such a path of data read in a read operation.

FIG. 1 is a schematic circuit diagram of a conventional semiconductor memory device 100. The semiconductor memory device 100 includes a memory cell 110 in an array block, a word line WL and a pair of bit lines BL and /BL connected to the memory cell 110, an equalization circuit 120 that precharges the bit lines BL and /BL, a pair of local input/output (I/O) lines LIO and /LIO to be connected to the bit lines BL and /BL in response to a column selection line signal CSL, a pair of global I/O lines GIO and /GIO to be connected to the local I/O lines LIO and /LIO in response to a control signal LGIOMUX, a pair of data I/O lines DIO and /DIO to be connected to the global I/O lines GIO and /GIO in response to a control signal IOMUX, and a data sense amplifier 130.

As described above, a voltage of data stored in the memory cell 110 is amplified by a bit line sense amplifier (not shown) and the data sense amplifier 130, and then, the data is read at a high logic level or a low logic level.

More specifically, during a read operation of the semiconductor memory device 100, an /RAS active command (not shown) is activated to activate a word line connected to a memory cell of a row address from which the data is to be read. When the word line is activated, data stored in all memory cells connected to the activated word line is transmitted to bit lines corresponding to the memory cells, respectively.

Next, the bit line sense amplifier amplifies a voltage of data output from the bit lines BL and /BL according to a logic level of the data, i.e., at a high logic level or a low level. Next, the data output from the bit lines BL and /BL is transmitted to the data I/O lines DIO and /DIO in response to the column selection line signal CSL activated in response to a /CAS active command (not shown).

Recent trends have seen an increase in integration density of semiconductor memory devices and a reduction of a voltage thereof. An increase in the density results in an increase in the load capacitance across each pair of data lines, and a reduction in the voltage results in a reduction in the difference between voltages of the pairs of data lines applied to corresponding amplifiers.

Accordingly, it becomes more and more difficult for amplifiers to detect data with a minimum voltage difference and amplify voltages of the data. Further, semiconductor memory devices are required to operate at high speeds. tRCD, which is a major parameter for high-speed operation of semiconductor memory devices, denotes a duration between an execution of an /RAS active command and a /CAS active command, i.e., an /RAS to /CAS delay time. The lower the tRCD value, the faster an operating speed of a system using a DRAM.

FIG. 2A illustrates a tRCD parameter of a semiconductor memory device, which is the time interval between execution of an active command ACTIVE CMD and a read/write command READ/WRITE CMD. FIG. 2B illustrates a relationship between amplification of data output from a pair of bit lines and the tRCD parameter.

The tRCD parameter has a minimum value when the difference in voltage or current between data output from the data I/O lines DIO and /DIO has a minimum value that the data sense amplifier 130 can detect.

Referring to FIG. 2B, while the tRCD parameter can be reduced to a minimum value, in an internal operation of the semiconductor memory device 100 of FIG. 1, the lower the tRCD value, the more likely it is that the column selection line signal CSL will be activated before voltages of data output from the bit lines BL and /BL are completely amplified. Thus, the difference in voltage or current between data output from the data I/O lines DIO and /DIO to be applied to the data sense amplifier 130 becomes reduced. If the difference in voltage or current is too small for the data sense amplifier 130 to detect, incorrect data may be read.

SUMMARY OF THE INVENTION

It is possible to increase the tRCD parameter by adding a sense amplifier capable of amplifying a voltage of data between the data sense amplifier 130 and a bit line sense amplifier (not shown), thereby improving a performance of the semiconductor memory device.

Further, when the added sense amplifier can be turned on if necessary, it is possible to reduce an amount of current required to use the added sense amplifier.

An embodiment of the present invention provides a local sense amplifier that can be controlled to be turned on only if necessary.

According to an aspect of the present invention, there is provided a semiconductor memory device comprising a plurality of memory cells in one or more array blocks; a pair of local input/output lines comprising a local input/output line and an inverted local input/output line; a pair of global input/output lines comprising a global input/output line and an inverted global input/output line; a local sense amplifier amplifying voltages of data signals output from the local input/output lines and transmitting the data to the global input/output lines in response to a local sense control signal; and a data sense amplifier amplifying voltages of data signals output from the data input/output lines connected to the global input/output lines and outputting the data from the semiconductor memory device in response to a sensing enable signal. The data sense amplifier can be a current type sense amplifier.

The semiconductor memory device can further include a load transistor unit allowing current to flow through the global input/output lines in response to a load signal, and a selection switching unit connecting the data sense amplifier to one of the memory cell array blocks in response to a selection signal. The load transistor unit comprises a first load transistor having a first terminal to which a first voltage is applied, a second terminal connected to the global input/output line, and a gate to which the load signal is input; and a second load transistor having a first terminal to which the first voltage is applied, a second terminal connected to the inverted global input/output line, and a gate to which the load signal is input.

The semiconductor memory device can further include a local input/output line precharge controller for precharging voltages of the local input/output lines to a predetermined voltage in response to precharge control signals.

According to another aspect of the present invention, there is provided a semiconductor memory device including a plurality of memory cell array blocks; a bit line sense amplifier amplifying voltages of data output from a pair of bit lines connected to the memory cell array blocks and transmitting the data to a pair of local input/output lines; a local sense amplifier amplifying voltages of data output from the local input/output lines and transmitting the data to a pair of global input/output lines in response to a local sense control signal; a data sense amplifier amplifying voltages of data output from a pair of data input/output lines connected to the global input/output lines and outputting the data from the semiconductor memory device in response to a sensing enable signal; and a controller activating the local sense control signal for a predetermined duration in response to a first signal and a second signal.

The first signal can be activated in response to a row active command, and the local sense amplifier can be activated for a predetermined duration after the first signal is activated.

The first signal is a bit line sense enable signal which activates the bit line sense amplifier, and the local sense amplifier is activated for a predetermined duration after the bit line sense enable signal is activated.

The second signal can be activated or deactivated to be in phase with a column selection line signal that connects the bit lines and the local input/output lines.

The controller preferably comprises a pulse generator generating a first pulse signal activated for a predetermined duration in response to the first signal; and a local sense control signal generator activating the local sense control signal when both the first pulse signal and the second signal are activated, and deactivating the local sense control signal when the second signal is deactivated.

The semiconductor memory device can further include a local input/output line precharge controller for precharging the local input/output lines in response to a precharge control signal, wherein the controller can further comprise a precharge control signal generator activating the precharge control signal for a predetermined duration when the local sense control signal is deactivated.

The controller is preferably located in a periphery region outside a memory core. The data sense amplifier is one of a current type sense amplifier and a voltage type sense amplifier.

According to yet another aspect of the present invention, there is provided a semiconductor memory device comprising a plurality of memory cell array blocks; a bit line sense amplifier amplifying voltages of data output from a pair of bit lines connected to the memory cell array blocks and transmitting the data to a pair of local input/output lines; a local sense amplifier amplifying voltages of data output from the local input/output lines and transmitting the data to a pair of global input/output lines in response to a predetermined signal; a data sense amplifier amplifying voltages of data output from a pair of data input/output lines connected to the global input/output lines and outputting the data from the semiconductor memory device in response to a sensing enable signal; and a local sense amplifier controller generating the predetermined signal which controls the local sense amplifier in response to a control signal and a local sense control signal. The local sense amplifier operates in response to the local sense control signal when the control signal is activated, and does not operate when the control signal is deactivated.

The local sense amplifier controller performs an AND operation on the control signal and the local sense control signal to generate the predetermined signal.

The control signal can be activated or deactivated by one of a mode register set and a fuse unit.

According to still another aspect of the present invention, there is provided a semiconductor memory device comprising a plurality of memory cell array blocks; a bit line sense amplifier amplifying voltages of data output from a pair of bit lines connected to the memory cell array blocks and transmitting the data to a pair of local input/output lines; a local sense amplifier amplifying voltages of data output from the local input/output lines and transmitting the data to a pair of global input/output lines in response to a local sense control signal; a data sense amplifier amplifying voltages of data output from a pair of data input/output lines connected to the global input/output lines and outputting the data from the semiconductor memory device in response to a sensing enable signal; and a controller deactivating the local sense control signal when a control signal is deactivated and activating the local sense control signal for a predetermined duration in response to a first signal and a second signal when the control signal is activated.

The control signal can be activated or deactivated by one of a mode register set and a fuse unit. The first signal is activated in response to a row active command, and the local sense amplifier is activated for a predetermined duration after the first signal is activated. The first signal is a bit line sense enable signal which activates the bit line sense amplifier, and the local sense amplifier is activated for a predetermined duration after the bit line sense enable signal is activated.

The control signal can be activated or deactivated to be in phase with a column selection line signal which connects the bit lines and the local input/output lines amplifier.

The controller comprises a third signal generator performing an AND operation on the control signal and the second signal to generate a third signal; a pulse generator generating a first pulse signal which is activated for a predetermined duration in response to the first signal; and a local sense control signal generator deactivating the local sense control signal when the third signal is deactivated and activating the local sense control signal when both the first pulse signal and the third signal are activated.

The semiconductor memory device can further include a local input/output line precharge controller precharging the local input/output lines in response to a precharge control signal, wherein the controller further comprises a precharge control signal generator activating the precharge control signal for a predetermined duration when the local sense control signal is deactivated.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION

Figure 1:
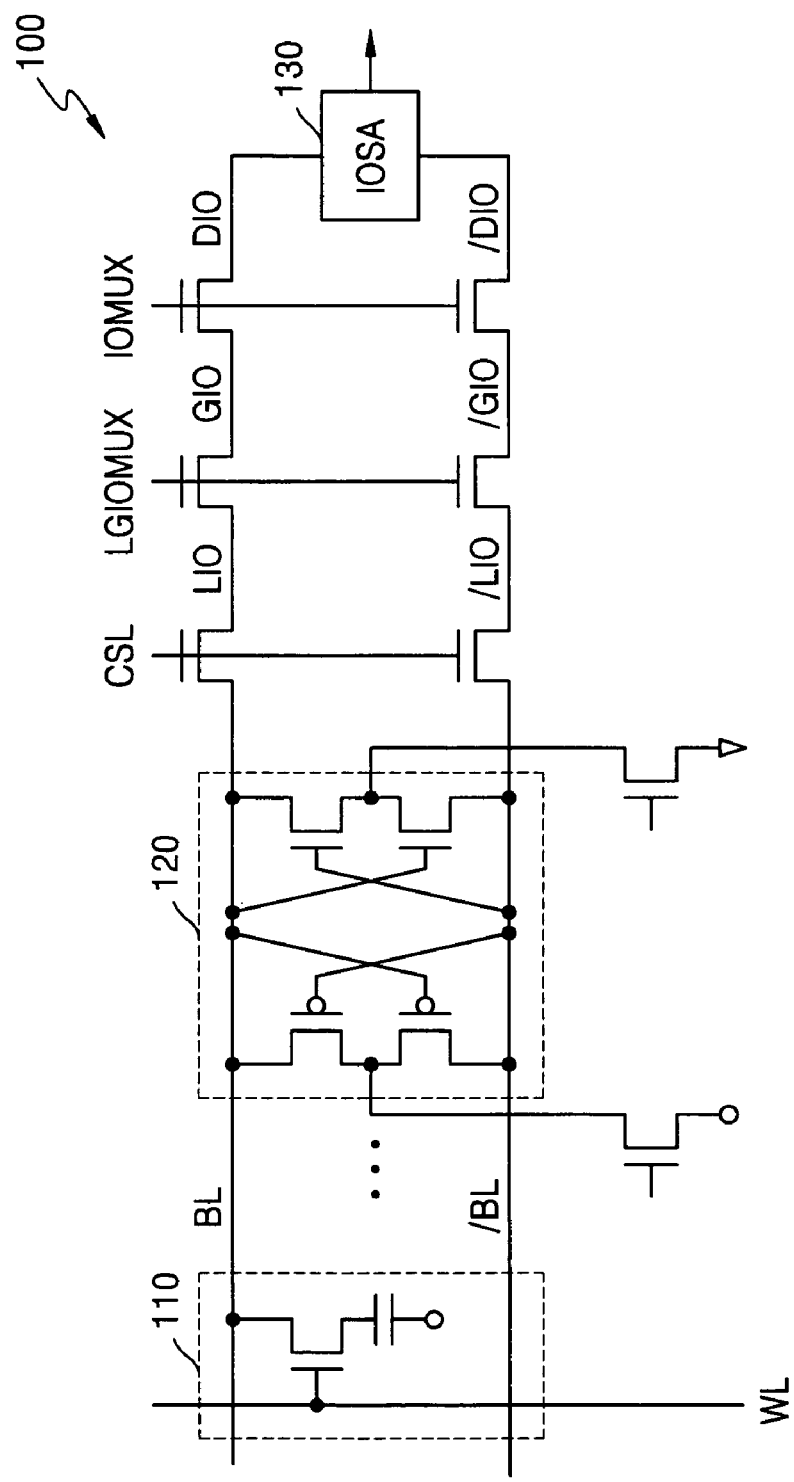
FIG. 1 is a schematic circuit diagram of a conventional semiconductor memory device.
Figure 2A:
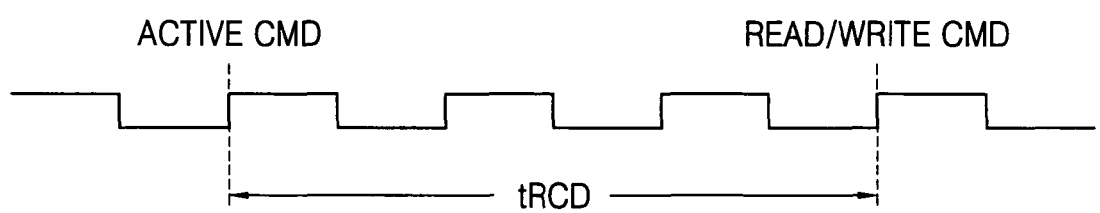
FIG. 2A illustrates a tRCD parameter of a semiconductor memory device.
Figure 2B:
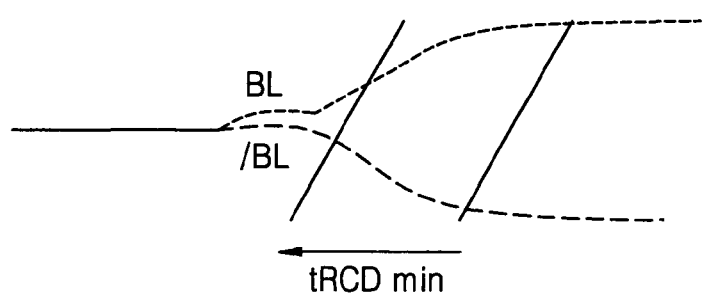
FIG. 2B illustrates a relationship between amplification of data output from a pair of bit lines and the tRCD parameter.

Hereinafter, exemplary embodiments of the present invention will be described in detail with reference to the accompanying drawings. Like reference numerals denote like elements in the drawings.

Figure 3:
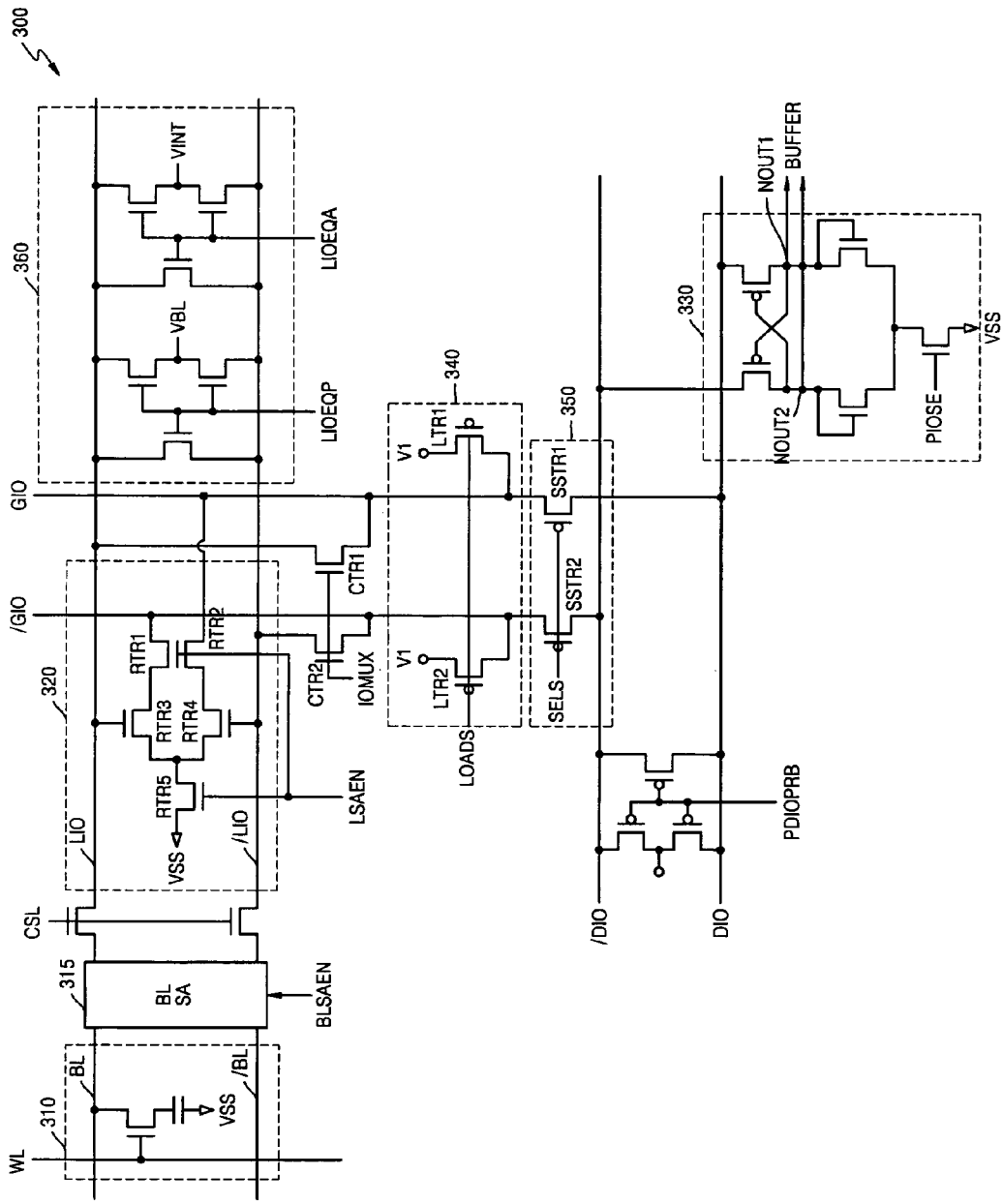
FIG. 3 is a circuit diagram of a semiconductor memory device according to an embodiment of the present invention.
Figure 4:
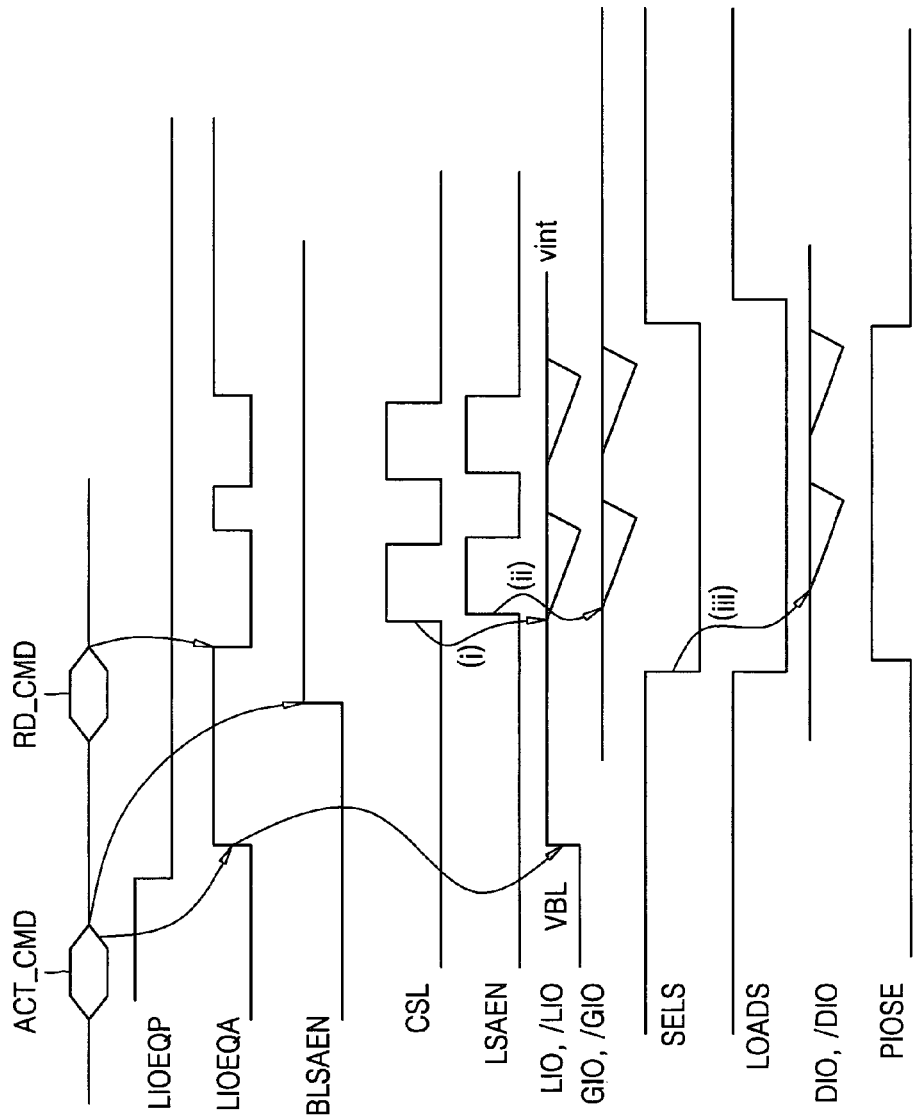
FIG. 4 is a timing diagram of a read operation of the semiconductor memory device illustrated in FIG. 3.

FIG. 3 is a circuit diagram of a semiconductor memory device 300 according to an embodiment of the present invention. FIG. 4 is a timing diagram of a read operation of the semiconductor memory device 300 according to an embodiment of the present invention.

Referring to FIGS. 3 and 4, the semiconductor memory device 300 includes a plurality of memory cells 310 in an array block, a pair of local input/output (I/O) lines LIO and /LIO, a pair of global I/O lines GIO and /GIO, a local sense amplifier 320, a local I/O line precharge controller 360, and a data sense amplifier 330. The local sense amplifier 320 amplifies voltages of data output from the local I/O lines LIO and /LIO and then transmits the data to the global I/O lines GIO and /GIO, in response to a local sense control signal LSAEN generated according to a read command.

The local I/O line precharge controller 360 precharges the local I/O lines LIO and /LIO to an operating voltage VINT during row activation of the memory device, and precharges them to a voltage VBL that is about half the operating voltage VINT during a precharge operation of the memory device.

The data sense amplifier 330, which in this embodiment is a current type sense amplifier, amplifies and outputs the difference in current between the data I/O lines DIO and /DIO connected to the global I/O lines GIO and /GIO in response to a sensing enable signal PIOSE generated according to a read command. That is, the semiconductor memory device 300 is constructed such that the local sense amplifier 320 and the current type data sense amplifier 330 are connected.

Hereinafter, an operation of the semiconductor memory device 300 according to an embodiment of the present invention is described in detail with reference to FIGS. 3 and 4.

It is assumed for this example that data is read from a memory cell that stores data 1. In a precharge state in which a row active command ACT_CMD has yet to be given, the local I/O lines LIO and /LIO are precharged by precharge controller 360 to a predetermined voltage VBL in response to a precharge control signal LIOEQP.

When the row active command ACT_CMD is given, the local I/O lines LIO and /LIO are precharged by precharge controller 360 to the operating voltage VINT in response to a precharge control signal LIOEQA. Also, data output from a memory cell 310 connected to an activated word line WL in a memory block is transmitted to the bit lines BL and /BL, and data output from the bit lines BL and /BL is amplified by a bit line sense amplifier 315 in response to a bit line sense amplification control signal BLSAEN.

When a read command RD_CMD is given, precharging of the local I/O lines LIO and /LIO in response to the precharge control signal LIOEQA is stopped, and the local I/O lines LIO and /LIO are floated at the operating voltage VINT. Next, a column selection line signal CSL is activated, and then data output from the bit lines BL and /BL is transmitted to the local I/O lines LIO and /LIO, thereby performing charge sharing. The local I/O line LIO is maintained at the operating voltage VINT, and the voltage of the inverted local I/O line /LIO becomes lower than the operating voltage VINT (i). The column selection line signal CSL may be continuously activated depending on a burst length. The local sense amplifier 320 amplifies voltages of data output from the local I/O lines LIO and /LIO in response to the local sense control signal LSAEN and transmits the data to the global I/O lines GIO and /GIO (ii). The local sense amplifier 320 maintains the local I/O line LIO at the operating voltage VINT and amplifies the voltage of the inverted local I/O line /LIO to a ground voltage VSS.

Transistors CTR1 and CTR2, which are both connected to respond to the control signal IOMUX, connect the global I/O lines GIO and /GIO to the local I/O lines LIO and /LIO respectively during a write operation, and are turned off during a read operation.

A selection switching unit 350 connects the global I/O lines GIO and /GIO to the data I/O lines DIO and /DIO in response to a selection signal SELS. That is, the selection switching unit 350 selects a bank (not shown) to be connected to the data I/O lines DIO and /DIO.

When the selection signal SELS is activated at a low logic level, transistors SSTR1 and SSTR2 are turned on to connect the global I/O lines GIO and /GIO to the data I/O lines DIO and /DIO (iii).

FIG. 3 illustrates the global I/O lines GIO and /GIO connected to the selection switching unit 350 for convenience. However, according to the present invention, a plurality of global I/O lines (not shown) and a plurality of memory arrays (not shown) may be connected to the data I/O lines DIO and /DIO. A load transistor unit 340 includes a first load transistor LTR1 and a second load transistor LTR2. A first voltage V1 is applied to a first terminal of the first load transistor LTR1, a second terminal of which is connected to the global I/O line GIO, and a load signal LOADS is input to its gate. The first voltage V1 is a predetermined voltage.

The first voltage V1 is applied to a first terminal of the second load transistor LTR2, a second terminal of which is connected to the inverted global I/O line /GIO, and the load signal LOADS is input to its gate.

The first and second load transistors LTR1 and LTR2 supply a predetermined current to the global I/O lines GIO and /GIO and the data I/O lines DIO and /DIO in response to the load signal LOADS. The current supplied to the inverted global I/O line /GIO is conducted to the ground voltage VSS via the local sense amplifier 320, and thus, a small amount of current is supplied to the inverted data I/O line /DIO. In contrast, since the current supplied to the global I/O line GIO is not conducted to the ground voltage VSS via the local sense amplifier 320, the current is supplied to the data I/O line DIO.

The data sense amplifier 330 detects the difference in current between the data I/O lines DIO and /DIO, amplifies the detected difference in current, transforms the amplified difference in current into a voltage, and outputs the voltage outside the semiconductor memory device 300 via output nodes NOUT1 and NOUT2, in response to the sensing enable signal PIOSE.

The local I/O lines LIO and /LIO must be precharged to the operating voltage VINT again to continuously activate the column selection line signal CSL to read data according to a burst length when a read command is given. Specifically, when the column selection line signal CSL is disabled, the local sense control signal LSAEN is also disabled and the local I/O lines LIO and /LIO are precharged again to the operating voltage VINT in response to the precharge control signal LIOEQA. The precharge control signal LIOEQA is activated at a high logic level to control a precharging operation when the column selection line signal CSL is deactivated, that is, when the local sense control signal LSAEN is deactivated. Then, a read operation is performed as described above.

As described above, the semiconductor memory device 300 is capable of increasing the tRCD parameter using the local sense amplifier 320 and the current type data sense amplifier 330. That is, the tRCD parameter is increased by amplifying a difference in voltage between data using the local sense amplifier 320 before the data is transmitted to the sense amplifier 330. The current type data sense amplifier 330 does not additionally require precharging and equalizing for a data operation and is thus helpful to operate the semiconductor memory device 300 at a high speed compared to a voltage type data sense amplifier. Accordingly, an operating frequency of the semiconductor memory device 300 is also increased.

Figure 5:
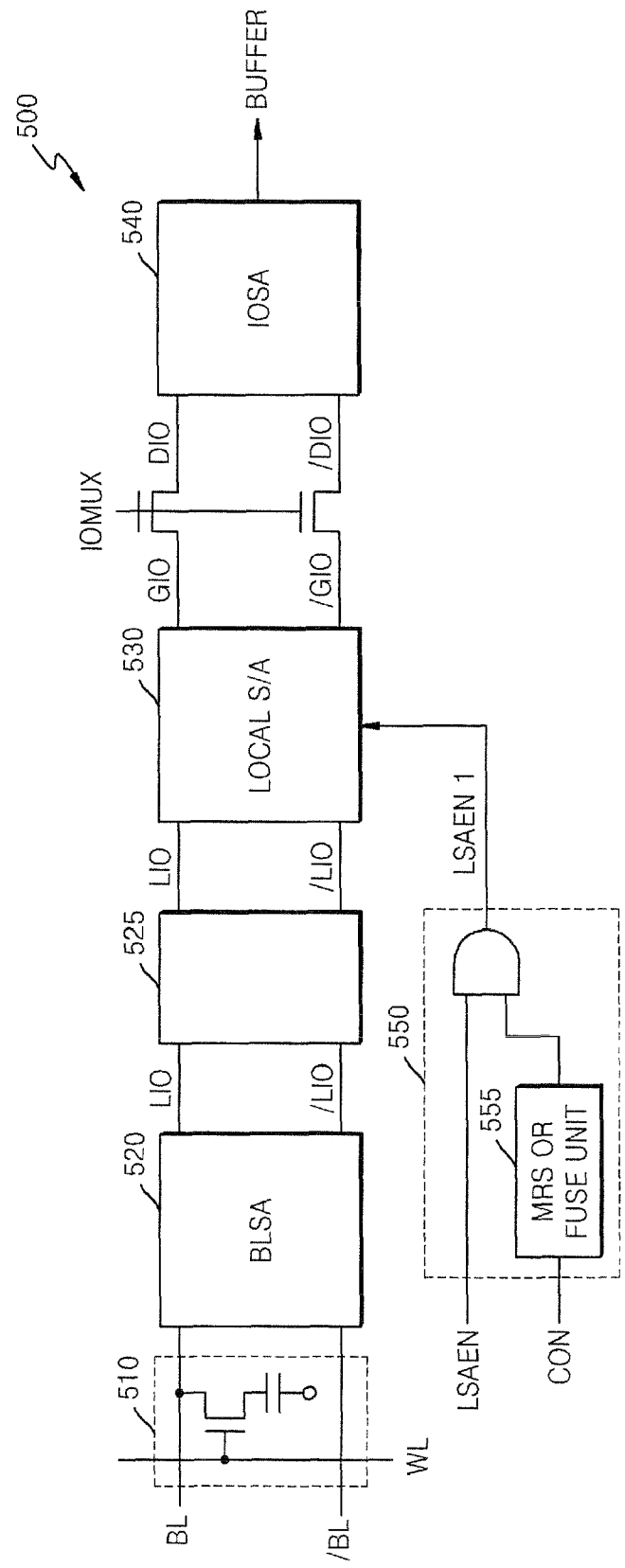
FIG. 5 is a block diagram of a semiconductor memory device according to another embodiment of the present invention.

FIG. 5 is a block diagram of a semiconductor memory device 500 according to another embodiment of the present invention. The semiconductor memory device 500 includes a plurality of memory cells 510, a word line WL and a pair of bit lines BL and /BL connected to each of the memory cells 510, a bit line sense amplifier 520, a local I/O line precharge controller 525, a local sense amplifier 530, a data sense amplifier 540, which may output to a buffer circuit BUFFER, and a local sense amplifier controller 550.

The constructions and operations of the memory cell arrays 510, the bit line sense amplifier 520, and the data sense amplifier 540 are the same as those of the memory cell arrays 310, the bit line sense amplifier 315, and the data sense amplifier 330 of the semiconductor memory device 300 of FIG. 3, respectively. However, unlike in the semiconductor memory device 300, the data sense amplifier 540 can be either a voltage type or a current type. The local sense amplifier controller 550 generates a signal LSAEN1 that determines whether the local sense amplifier 530 must be activated by performing an AND operation on a control signal CON input to a mode register set (MRS) or a fuse unit 555, for example, and a local sense control signal LSAEN generated according to a read command. The local sense amplifier controller 550 can include an AND gate. To increase the tRCD parameter when operating the semiconductor memory device 500, the control signal CON input to the MRS or fuse unit 555 is enabled and the local sense control signal LSAEN is generated according to a read command to operate the local sense amplifier 530.

To reduce the consumption of current regardless of the tRCD parameter when operating the semiconductor memory device 500, the control signal CON can be disabled so that the local sense amplifier 530 is kept off, i.e., non-amplifying. The construction and operation of the local sense amplifier controller 550 that generates the control signal CON to be maintained in an activation or deactivation state by the MRS or fuse unit 555 are known to those skilled in the art, and therefore will not be described.

To reduce the consumption of current regardless of the tRCD parameter when operating the semiconductor memory device 500, the control signal CON can be disabled so that the local sense amplifier 530 is kept off, i.e., non-amplifying. The construction and operation of the local sense amplifier controller 550 that generates the control signal CON to be maintained in an activation or deactivation state by the MRS or the fuse unit, are known to those skilled in the art, and therefore will not be described.

Figure 6:
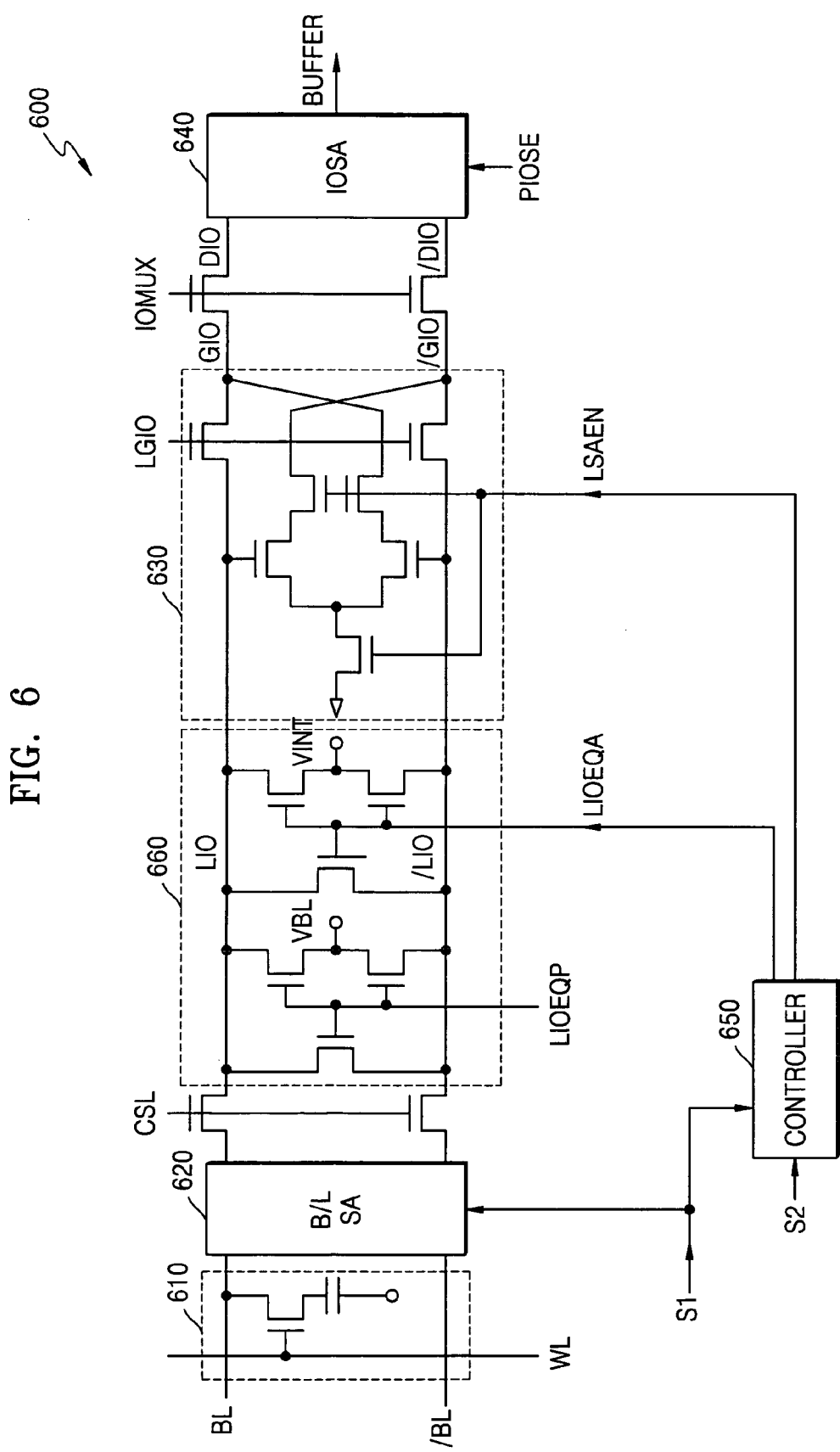
FIG. 6 is a mixed block and circuit diagram of a semiconductor memory device according to yet another embodiment of the present invention.

FIG. 6 is a diagram of a semiconductor memory device 600 according to another embodiment of the present invention. The semiconductor memory device 600 includes a plurality of memory cells 610, a word line WL and a pair of bit lines BL and /BL connected to each of the memory cells 610, a bit line sense amplifier 620, a local I/O line precharge controller 660, a local sense amplifier 630, a data sense amplifier 640, and a controller 650.

The bit line sense amplifier 620 amplifies voltages of data output from a pair of bit lines BL and /BL connected to the memory cell arrays 510 and transmits the data to a pair of local I/O lines LIO and /LIO.

The local sense amplifier 630 amplifies voltages of data output from the local I/O lines LIO and /LIO and transmits the data to a pair of global I/O lines GIO and /GIO in response to a local sense control signal LSAEN.

The data sense amplifier 640 amplifies voltages of data output from a pair of data I/O lines DIO and /DIO connected to the global I/O lines GIO and /GIO and outputs the data from the semiconductor memory device 600 in response to a sensing enable signal PIOSE. The data sense amplifier 640 can be a current type sense amplifier or a voltage type sense amplifier.

The constructions and operations of the array of memory cells 610, the bit line sense amplifier 620, the local I/O line precharge controller 660, the local sense amplifier 630, and the data sense amplifier 640 are the same as those of memory cell arrays, a bit line sense amplifier, a local I/O line precharge controller, a local sense amplifier, and a data sense amplifier of a semiconductor memory device as described above.

The controller 650 activates the local sense control signal LSAEN only under predetermined conditions in response to a first signal S1 and a second signal S2. That the local sense control signal LSAEN is activated only under the predetermined conditions must be understood that the local sense amplifier 630 operates only under the same predetermined conditions.

The first signal S1 is activated in response to a row active command. In particular, in this embodiment, the first signal S1 is a bit line sense enable signal that activates the bit line sense amplifier 620 in response to a row active command ACT_CMD, and the second signal S2 is generated to be in phase with a column selection line signal generated according to a read command.

More specifically, a predetermined delay time after the bit line sense enable signal S1 is activated is set to a minimum tRCD value, and the local sense amplifier 630 operates only when a column selection line signal CSL is activated within the delay time according to a read command. If the local sense amplifier 630 operates only when the column selection line signal CSL is activated within the delay time, it is possible to reduce a consumption of current compared to when the local sense amplifier 630 always operates.

Figure 7:
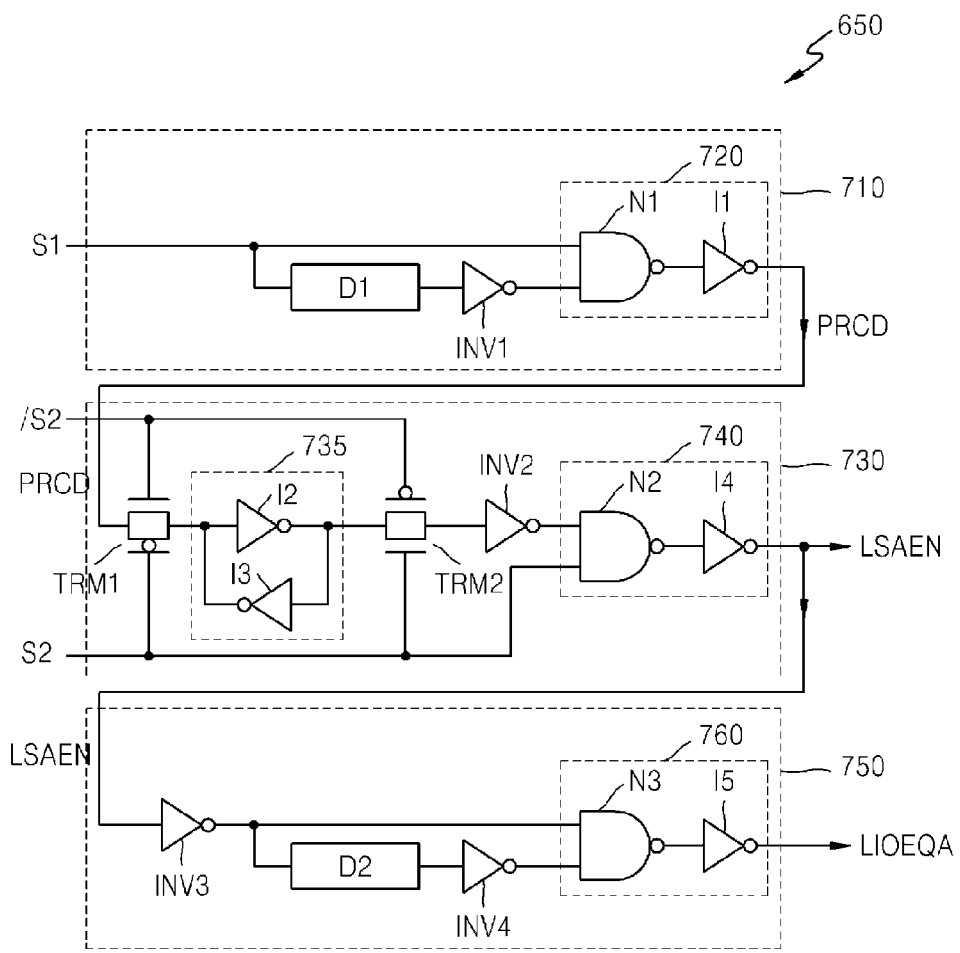
FIG. 7 is a circuit diagram of a controller illustrated in FIG. 6.
Figure 8:
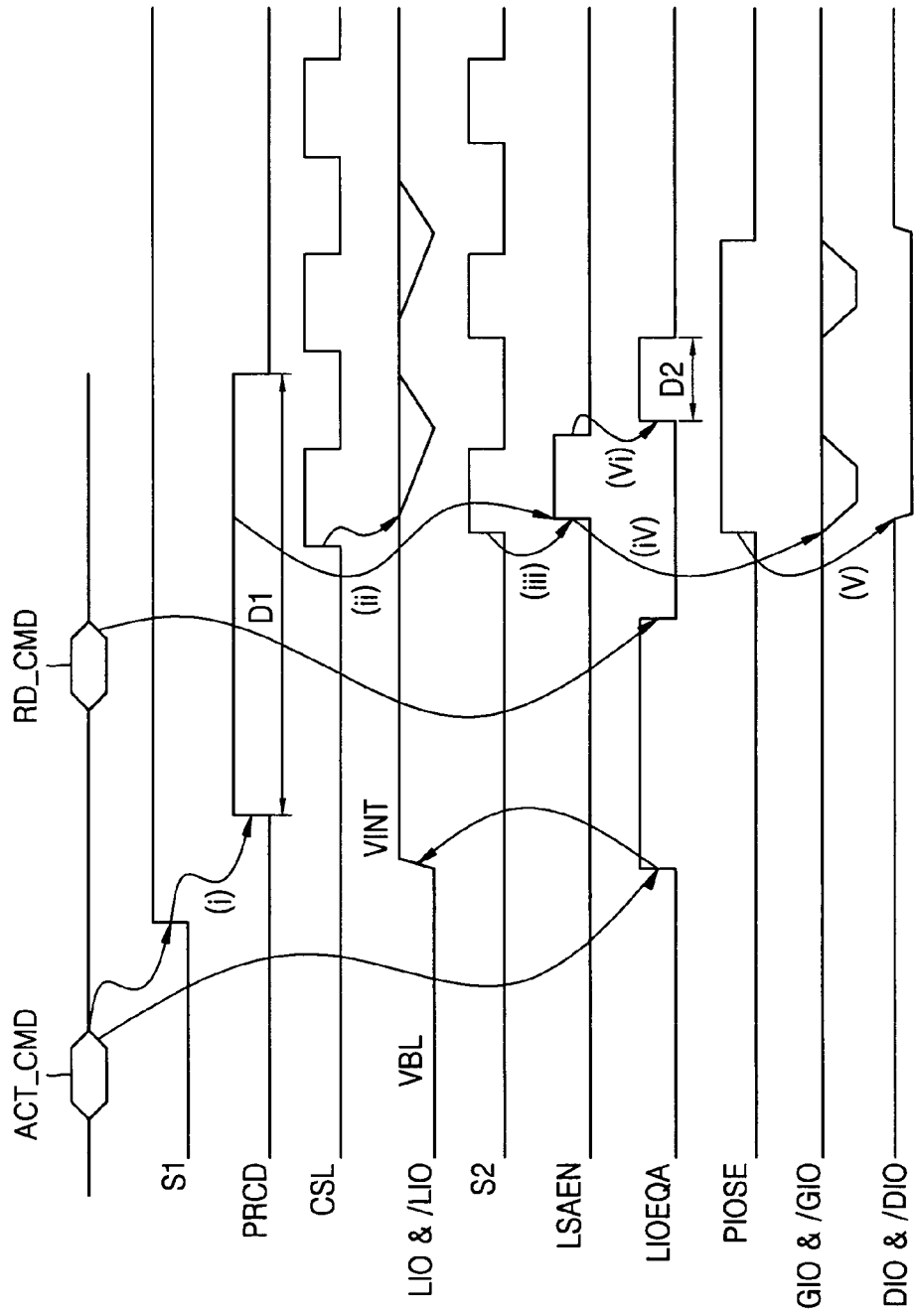
FIG. 8 is a timing diagram of an operation of the semiconductor memory device illustrated in FIG. 6.

FIG. 7 is a circuit diagram of the controller 650 of FIG. 6 according to an embodiment of the present invention. FIG. 8 is a timing diagram illustrating an operation of the semiconductor memory device 600 according to an embodiment of the present invention. The operation of the semiconductor memory device 600 according to this embodiment of the present invention will now be described in greater detail with reference to FIGS. 6 through 8.

The controller 650 includes a pulse generator 710 and a local sense control signal generator 730. To begin, a row active command ACT_CMD is given. Then the pulse generator 710 generates a first pulse signal PRCD that is activated for a predetermined duration in response to the first signal S1 (i). As described above, the first signal S1 is a bit line sense enable signal that activates the bit line sense amplifier 620 after a row active command is given.

More specifically, the pulse generator 710 includes a first delayer D1 that delays the first signal S1, a first inverter INV 1 that inverts an output of the first delayer D1, and a first AND gate unit 720 that performs an AND operation on an output of the first inverter INV1 and the first signal S1 and outputs the result as the first pulse signal PRCD. The first OR gate unit 720 can include a NAND gate N1 and an inverter I1.

The delayer D1 determines the duration for which the first pulse signal PRCD is to be activated. The pulse generator 710 is an automatic pulse generator that is activated for a predetermined duration in response to the first signal S1. The construction of the pulse generator 710 according to the present invention is not limited to the circuit shown.

When a read command RD_CMD is given, precharging of the local I/O lines LIO and /LIO in response to the precharge control signal LIOEQA is stopped, and the local I/O lines LIO and /LIO are floated at the operating voltage VINT.

The local sense control signal generator 730 activates a local sense control signal LSAEN when both the first pulse signal PRCD and the second signal S2 are activated, and deactivates it when the second signal S2 is deactivated. The second signal S2 is activated or deactivated to be in phase with the column selection line signal CSL that connects the bit lines BL and /BL to the local I/O lines LIO and /LIO. It is possible to synchronize the local sense control signal LSAEN with the column selection line signal CSL by associating the first pulse signal PRCD with the second signal S2. The local sense control signal generator 730 includes a first transmission gate TRM1 that transmits or blocks the first pulse signal PRCD in response to the second signal S2, a latch unit 735 that latches an output of the first transmission gate TRM1 and includes inverters I2 and I3, a second transmission gate TRM2 that transmits or blocks an output of the latch unit 735 in response to the second signal S2, a second inverter INV2 that inverts an output of the second transmission gate TRM2, and a second AND gate unit 740 that performs an AND operation on an output of the second inverter INV2 and the second signal S2 and outputs the result as the local sense control signal LSAEN. The second signal S2 is provided to the gate of the PMOS transistor of the first transmission gate TRM1 and the NMOS transistor of the second transmission gate TRM2, while the inverted second signal /S2 is provided to the gate of the NMOS transistor of first transmission gate TRM1 and the PMOS transistor of second transmission gate TRM2.

The second AND gate unit 740 can include a NAND gate N2 and an inverter I4. When the second signal S2 is at a low logic level, the first pulse signal PRCD is stored in the latch unit 735. When the second signal S2 is at a high logic level, the first pulse signal PRCD sequentially passes through the second transmission gate TRM2 and the second AND gate unit 740, and is then output as the local sense control signal LSAEN from the second AND gate unit 740. While the first pulse signal PRCD is activated, data is transmitted to the local I/O lines LIO and /LIO in response to the column selection line signal CSL, and the local sense control signal LSAEN is activated in response to the second signal S2 activated in phase with the column selection line signal CSL (iii).

Then, referring to FIG. 6, a voltage of the data output from the local I/O lines LIO and /LIO is amplified by the local sense amplifier 630, the data is transmitted to the global I/O lines GIO and /GIO (iv). Next, the data sense amplifier 640 activated in response to the sensing enable signal PIOSE amplifies a voltage of data transmitted to the data I/O lines DIO and /DIO from the global I/O lines GIO and /GIO, and outputs the data from the semiconductor memory device 600 (v).

When the first pulse signal PRCD is activated for a predetermined time and then deactivated, the local sense control signal LSAEN is not activated even if the second signal S2 is activated. Therefore, the local sense amplifier 630 operates for a predetermined time after the first signal S1, that is, the bit line sense enable signal, is activated.

The semiconductor memory device 600 further includes a local I/O line precharge controller 660 that precharges the local I/O lines LIO and /LIO in response to a precharge control signal LIOEQA. The controller 650 as shown in FIG. 7 further includes a precharge control signal generator 750 that activates the precharge control signal LIOEQA for a predetermined time when the local sense control signal LSAEN is deactivated.

The local I/O line precharge controller 660 precharges the local I/O lines LIO and /LIO when the column selection line signal CSL is deactivated, that is, while the local sense amplifier 630 does not operate.

The precharge control signal generator 750 includes a third inverter INV3 that inverts the local sense control signal LSAEN, a second delayer D2 that delays an output of the third inverter INV3, a fourth inverter INV4 that inverts an output of the second delayer D2, and a third AND gate unit 760 that performs an AND operation on the output of the third inverter INV3 and an output of the fourth inverter INV4 to generate the precharge control signal LIOEQA.

The third AND gate unit 760 can include a NAND gate N3 and an inverter I5. The precharge control signal LIOEQA is activated for a predetermined duration when the local sense control signal LSAEN is deactivated (vi). The duration for which the precharge control signal LIOEQA is activated is determined by the second delayer D2.

As described above, use of the controller 650 allows the local sense amplifier 630 of the semiconductor memory device 600 to operate only for a predetermined time after the bit line sense enable signal is activated, thereby increasing the TRCD parameter and reducing the consumption of current. The controller 650 is arranged in a periphery region outside a memory core.

Figure 9:
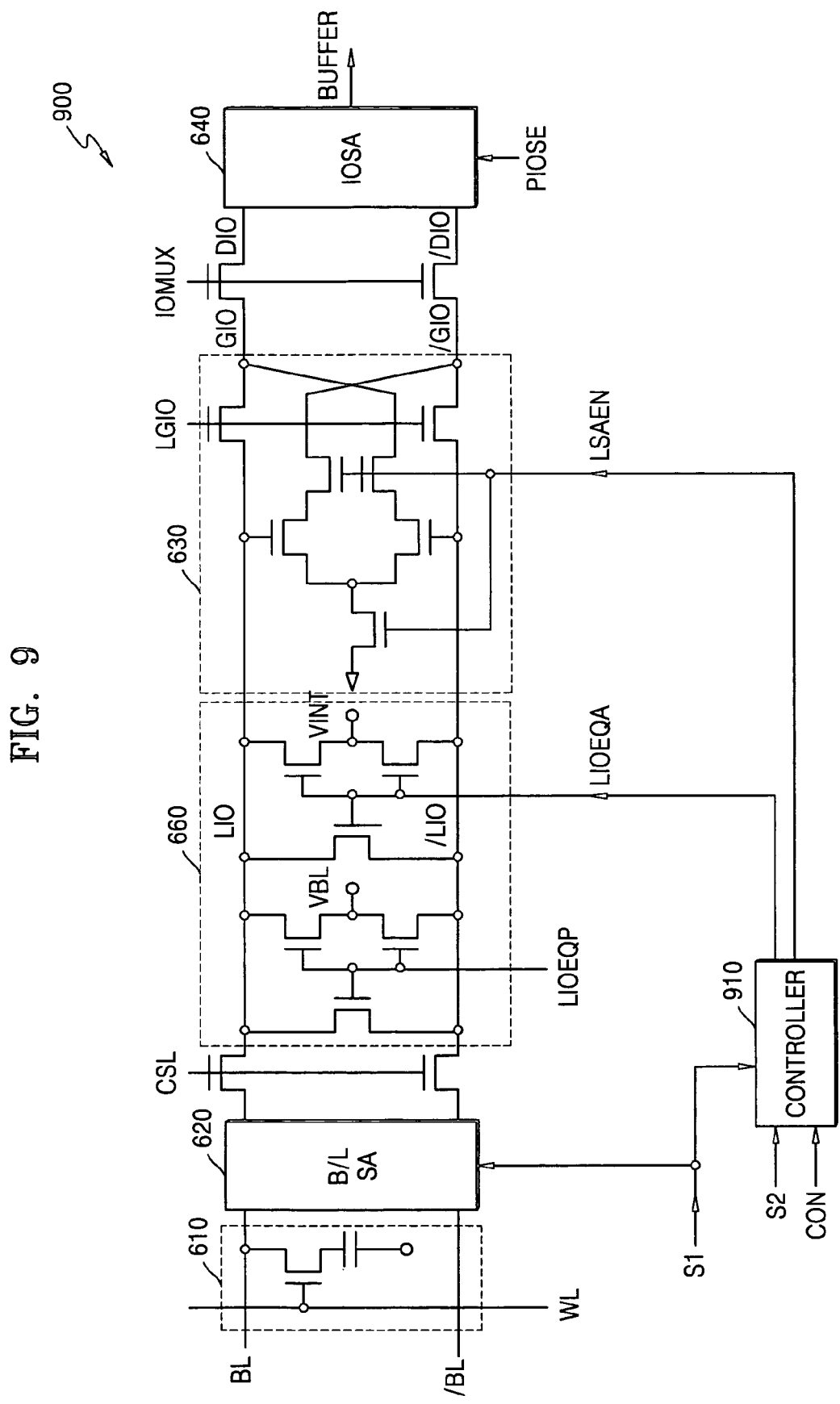
FIG. 9 is a block diagram of a semiconductor memory device according to still another embodiment of the present invention.
Figure 10:
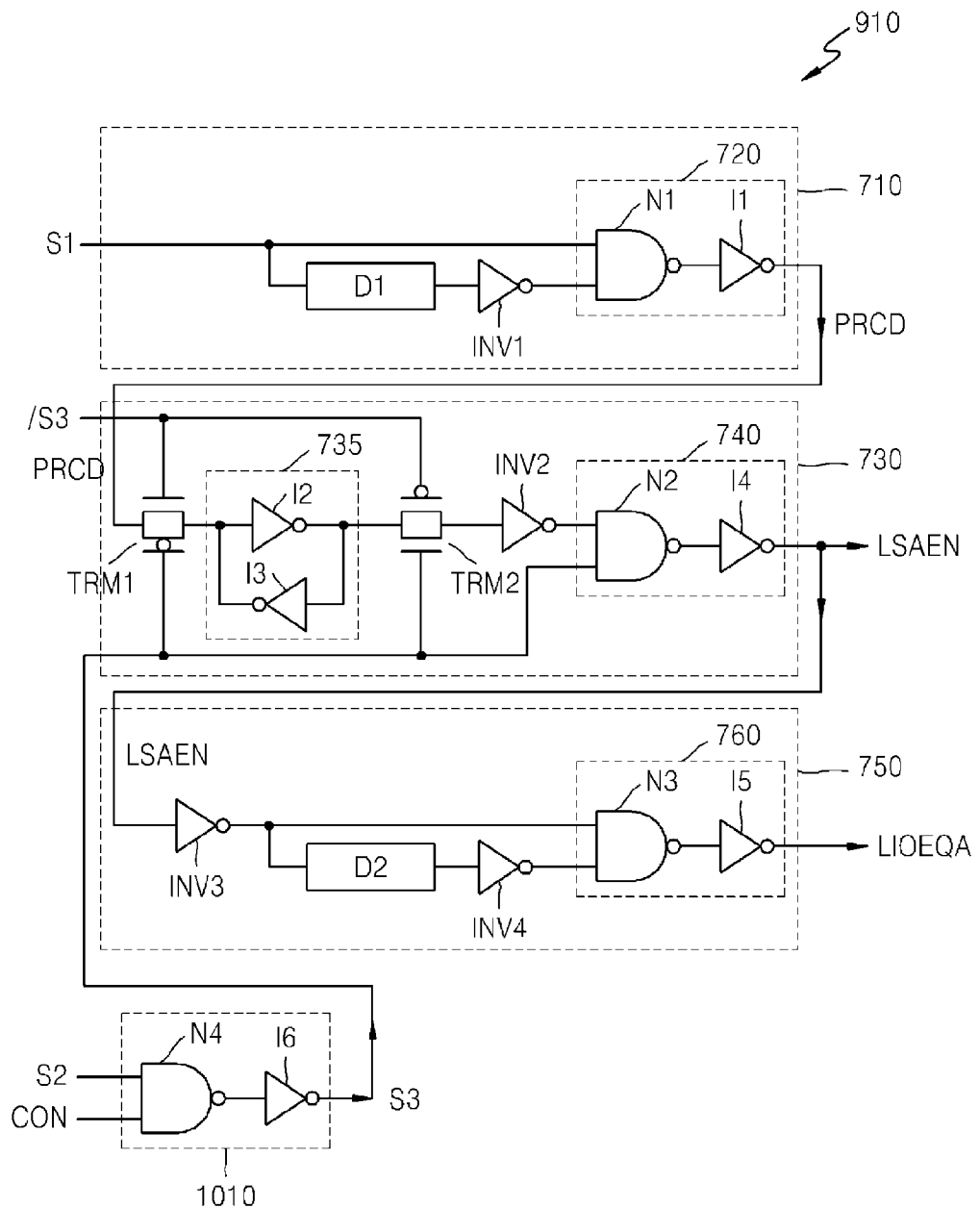
FIG. 10 is a circuit diagram of a controller illustrated in FIG. 9.

FIG. 9 is a block diagram of a semiconductor memory device 900 according to still another embodiment of the present invention. FIG. 10 is a circuit diagram of a controller 910 of FIG. 9.

Referring to FIGS. 9 and 10, the semiconductor memory device 900 includes a plurality of memory cells 610, a word line WL and a pair of bit lines BL and /BL connected to each of the memory cells 610, a bit line sense amplifier 620, a local I/O line precharge controller 660, a local sense amplifier 630, a data sense amplifier 640, which may output to a buffer circuit BUFFER, and the controller 910. The controller 910 deactivates a local sense control signal LSAEN when a control signal CON is deactivated, and activates the local sense control signal LSAEN only in a certain case in response to first and second signals Si and S2 when the control signal CON is activated.

The controller 910 performs both the functions of the local sense amplifier controller 550 of FIG. 5 and the controller 650 of FIG. 6. To reduce a consumption of current regardless of the tRCD parameter when operating the semiconductor memory device 900, the controller 910 deactivates the local sense control signal so that the local sense amplifier 630 does not operate in response to the control signal CON.

In contrast, to increase the tRCD parameter and reduce the consumption of current in operating the semiconductor memory device 900, the controller 910 receives the activated control signal CON, and activates the local sense control signal LSAEN for certain cases in response to the first and second signals S1 and S2, similar to the controller 650 of FIG. 6. Referring to FIG. 10, the controller 910 includes a third signal generator 1010, a pulse generator 710, and a local sense control signal generator 730. The third signal generator 1010 generates a third signal S3 by performing an AND operation on the control signal CON and the second signal S2. The pulse generator 710 generates a first pulse signal PRCD activated for a predetermined duration in response to the first signal S1.

The local sense control signal generator 730 deactivates the local sense control signal LSAEN when the third signal S3 is deactivated, and activates it when both the first pulse signal PRCD and the third signal S3 are activated.

The third signal generator 1010 includes a NAND gate N4 and an inverter 16. When the control signal CON is at a low logic level, the third signal S3 is always at a low logic level, and then, the local sense control signal generator 730 deactivates the local sense control signal LSAEN. When the control signal CON is at a high logic level, the logic level of the third signal S3 becomes equal to that of the second signal S2. That is, the third signal generator 1010 inputs the third signal S3 to the local sense control signal generator 730 in the same manner in which the second signal S2 is input to the local sense control signal generator 730 of FIG. 7. In this case, the operation of the third signal generator 1010 is the same as that of the controller 650 of FIG. 6.

As described above, a semiconductor memory device according to the present invention is capable of turning on or off a local sense amplifier according to operating conditions, thereby increasing a tRCD parameter and reducing a consumption of current. Also, a local sense amplifier is combined with a current type data sense amplifier that does not require precharging and equalizing during a read operation, thus improving an operating speed of the semiconductor memory device.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A semiconductor memory device comprising:
   a plurality of memory cells;
   a pair of bit lines connected to the memory cells;
   a bit line sense amplifier for amplifying voltages of first data output from the pair of bit lines and for transmitting the first data to a pair of local input/output lines;
   a local sense amplifier for amplifying second data output from the local input/output lines and for transmitting the second data to a pair of global input/output lines in response to a local sense control signal;
   a data sense amplifier for amplifying third data output from the pair of data input/output lines connected to the global input/output lines and for outputting the third data from the semiconductor memory device in response to a sensing enable signal;
   a multiplexer in a data path between the local sense amplifier and the data sense amplifier, responsive to a multiplexer control signal to connect the local input/output lines to the global input/output lines; and
   a controller for activating the local sense control signal within a predetermined duration in response to a first signal and a second signal, the controller comprising a pulse generator generating a first pulse signal activated for a predetermined duration in response to the first signal, and a local sense control signal generator activating the local sense control signal when both the first pulse signal and the second signal are activated, and deactivating the local sense control signal when the second signal is deactivated.

2. The semiconductor memory device of claim 1, wherein the first signal is activated in response to a row active command, wherein the local sense control signal is a local sense amplifier enable signal to enable the local sense amplifier, and wherein the controller activates the local sense amplifier enable signal only within a predetermined duration after the first signal is activated.

3. The semiconductor memory device of claim 1, wherein the second signal is activated or deactivated to be in a phase with a column selection line signal that connects the bit lines and the local input/output lines.

4. The semiconductor memory device of claim 1, wherein the pulse generator comprises:
   a first delayer for delaying the first signal;
   a first inverter for inverting an output of the first delayer; and
   a first AND gate unit for performing an AND operation on an output of the first inverter and the first signal to generate the first pulse signal.

5. The semiconductor memory device of claim 1, wherein the local sense control signal generator comprises:
   a first transmission gate for transmitting or blocking the first pulse signal in response to the second signal;
   a latch unit for latching an output of the first transmission gate;
   a second transmission gate for transmitting or blocking an output of the latch unit in response to the second signal;
   a second inverter for inverting an output of the second transmission gate; and
   a second AND gate unit for performing an AND operation on an output of the second inverter and the second signal to generate the local sense control signal.

6. The semiconductor memory device of claim 1, further comprising a local input/output line precharge controller for precharging the local input/output lines in response to a precharge control signal,
   wherein the controller further comprises a precharge control signal generator activating the precharge control signal for a predetermined duration when the local sense control signal is deactivated.

7. The semiconductor memory device of claim 6, wherein the precharge control signal generator comprises:
   a third inverter inverting the local sense control signal;
   a second delayer delaying an output of the third inverter;
   a fourth inverter inverting an output of the second delayer; and a third AND gate unit performing an AND operation on the output of the third inverter and an output of the fourth inverter to generate the precharge control signal.

8. The semiconductor memory device of claim 1, wherein the controller is located in a periphery region outside a memory core.

9. The semiconductor memory device of claim 1, wherein the data sense amplifier is a current type sense amplifier.

10. The semiconductor memory device of claim 1, wherein the predetermined duration occurs within a first portion of a burst read operation.

11. The semiconductor memory device of claim 10, wherein the first portion of the burst read operation includes a first operation to access bit line sense amplifier data, but not subsequent operations to access the bit line sense amplifier data during the burst read operation.

12. The semiconductor memory device of claim 1, wherein the local sense control signal is a local sense amplifier enable signal enabling the local sense amplifier, and the controller activates the local sense amplifier enable signal in phase with a column selection line signal that operates to connect the bit lines and the local input/output lines.

13. The semiconductor device of claim 1, further comprising:
switching circuitry operable to connect the local input/output lines to the pair of bit lines,
wherein the controller is operable to activate the local sense amplifier for a first portion of a read operation while the switching circuitry connects the local input/output lines to the bit lines, and is operable to cause the local sense amplifier to be inactive during a second portion of the read operation while the switching circuitry connects the local input/output lines to the bit lines.

14. The semiconductor device of claim 1,
wherein the read operation includes generation of a series of column select line pulses, and
wherein the controller is operable to activate the local sense amplifier during the read operation during only a part of the series of column select line pulses.

15. The semiconductor device of claim 1,
wherein the read operation includes generation of a series of column select line active signals, and
wherein the controller is operable to cause the local sense amplifier to be active for a first portion of the read operation during the generation of at least one column select line active signal and to cause the local sense amplifier to be inactive for a remainder of the read operation, after the first portion, during which further column select line active signals are generated.

16. The semiconductor device of claim 15, wherein the controller is operable to cause the local sense amplifier to be active for only the first column select line active signal generated during the read operation.

17. The semiconductor device of claim 1, wherein the controller is operable to activate the local sense amplifier in synchronism with an activation of a column select signal.

18. A semiconductor memory device comprising:
a plurality of memory cells;
a pair of bit lines connected to the memory cells;
a bit line sense amplifier for amplifying voltages of first data output from the pair of bit lines and for transmitting the first data to a pair of local input/output lines;
a local sense amplifier for amplifying second data output from the local input/output lines and for transmitting the second data to a pair of global input/output lines in response to a local sense control signal;
a data sense amplifier for amplifying third data output from the pair of data input/output lines connected to the global input/output lines and for outputting the third data from the semiconductor memory device in response to a sensing enable signal;
a multiplexer in a data path between the local sense amplifier and the data sense amplifier, responsive to a multiplexer control signal to connect the local input/output lines to the global input/output lines; and
a controller for activating the local sense control signal within a predetermined duration in response to a first signal and a second signal,
wherein the first signal is a bit line sense enable which activates the bit line sense amplifier,
wherein the local sense control signal is a local sense amplifier enable signal to enable the local sense amplifier, and
wherein the controller activates the local sense amplifier enable signal only within the predetermined duration after the bit line sense enable signal is activated.

19. A semiconductor memory device comprising:
a plurality of memory cells;
a pair of bit lines connected to the memory cells;
a bit line sense amplifier for amplifying voltages of data output from the pair of bit lines and for transmitting the data to a pair of local input/output lines;
a local sense amplifier for amplifying voltages of data output from the local input/output lines and for transmitting the data to a pair of global input/output lines in response to a predetermined signal;
a data sense amplifier for amplifying voltages of data output from the global input/output lines and for outputting the data from the semiconductor memory device in response to a sensing enable signal;
a multiplexer in a data path between the local sense amplifier and the data sense amplifier, responsive to a multiplexer control signal to connect the local input/output lines to the global input/output lines; and
a local sense amplifier controller for generating the predetermined signal that controls the local sense amplifier in response to a control signal and a local sense control signal,
wherein the local sense amplifier operates in response to the local sense control signal when the control signal is activated, and does not operate when the control signal is deactivated, and
wherein the data sense amplifier is a current type sense amplifier.

20. The semiconductor memory device of claim 19, wherein the local sense amplifier controller performs an AND operation on the control signal and the local sense control signal to generate the predetermined signal.

21. A semiconductor memory device comprising:
a plurality of memory cells;
a pair of bit lines connected to the memory cells;
a bit line sense amplifier for amplifying voltages of data output from the pair of bit lines and for transmitting the data to a pair of local input/output lines;
a local sense amplifier for amplifying voltages of data output from the local input/output lines and for transmitting the data to a pair of global input/output lines in response to a local sense control signal;
a data sense amplifier for amplifying data output from the global input/output lines and for outputting the data from the semiconductor memory device in response to a sensing enable signal;

a multiplexer in a data path between the local sense amplifier and the data sense amplifier responsive to a multiplexer control signal to connect the local input/output lines to the global input/output lines;

a controller for deactivating the local sense control signal when a control signal is deactivated and for activating the local sense control signal only within a predetermined duration in response to a first signal and a second signal when the control signal is activated; and a pulse generator for generating a first pulse signal which is activated for the predetermined duration in response to the first signal.

22. The semiconductor memory device of claim 21, wherein the first signal is activated in response to a row active command, and
the local sense amplifier is activated within predetermined duration after the first signal is activated.

23. The semiconductor memory device of claim 21, wherein the first signal is a bit line sense enable signal which activates the bit line sense amplifier, and the local sense amplifier is activated within a predetermined duration after the bit line sense enable signal is activated.

24. The semiconductor memory device of claim 21, wherein the control signal is activated or deactivated to be in phase with a column selection line signal which connects the bit lines and the local input/output lines amplifier.

25. The semiconductor memory device of claim 21, wherein the controller comprises:
a third signal generator for performing an AND operation on the control signal and the second signal to generate a third signal; and
a local sense control signal generator for deactivating the local sense control signal when the third signal is deactivated and for activating the local sense control signal when both the first pulse signal and the third signal are activated.

26. The semiconductor memory device of claim 25, wherein the pulse generator comprises:
a first delayer for delaying the first signal;
a first inverter for inverting an output of the first delayer; and
a first AND gate unit for performing an AND operation on an output of the first inverter and the first signal to generate the first pulse signal.

27. The semiconductor memory device of claim 25, wherein the local sense control signal generator comprises:
a first transmission gate for transmitting or blocking the first pulse signal in response to the third signal;
a latch unit for latching an output of the first transmission gate;
a second transmission gate for transmitting or blocking an output of the latch unit in response to the third signal;
a second inverter for inverting an output of the second transmission gate; and
a second AND gate unit for performing an AND operation on an output of the second inverter and the second signal to generate the local sense control signal.

28. The semiconductor memory device of claim 21, further comprising a local input/output line precharge controller for precharging the local input/output lines in response to a precharge control signal,
wherein the controller further comprises a precharge control signal generator for activating the precharge control signal for a predetermined duration when the local sense control signal is deactivated.

29. The semiconductor memory device of claim 28, wherein the precharge control signal generator comprises:

a third inverter for inverting the local sense control signal;
a second delayer for delaying an output of the third inverter;
a fourth inverter for inverting an output of the second delayer; and
a third AND gate unit for performing an AND operation on the output of the third inverter and an output of the fourth inverter to generate the precharge control signal.

30. The semiconductor memory device of claim 21, wherein the controller is located in a periphery region outside a memory core.

31. The semiconductor memory device of claim 21, wherein the data sense amplifier is one of a current type sense amplifier and a voltage type sense amplifier.

32. A method of operating a semiconductor memory device that includes:
a plurality of memory cells;
a pair of bit lines connected to the memory cells;
a bit line sense amplifier for amplifying voltages of data output from the pair of bit lines and for transmitting data to a pair of local input/output lines; and
a data sense amplifier for amplifying voltages of data output from a pair of global input/output lines and for outputting the data from the semiconductor memory device in response to a sensing enable signal,
the method comprising:
local sense amplifying voltages of data output from the local input/output lines and transmitting the data output from the local input/output lines to the pair of global input/output lines in response to a predetermined signal;
selectively connecting the global input/output lines to the data sense amplifier;
generating a pulse signal, the pulse signal having a pulse duration of a predetermined duration;
generating the predetermined signal which controls the local sense amplifying in response to a control signal and a local sense control signal, the predetermined signal being generated only when the control signal is activated and only during the pulse duration of the pulse signal, and not being generated when the control signal is deactivated.

33. A semiconductor device comprising:
a plurality of memory cells;
a pair of bit lines connected to the memory cells;
a bit line sense amplifier for amplifying voltages of first data output from the pair of bit lines and for transmitting the first data to a pair of local input/output lines;
a local sense amplifier for amplifying second data output from the local input/output lines and for transmitting the second data to a pair of global input/output lines in response to a local sense control signal;
a data sense amplifier for amplifying third data output from the pair of data input/output lines connected to the global input/output lines and for outputting the third data from the semiconductor memory device in response to a sensing enable signal;
a multiplexer in a data path between the local sense amplifier and the data sense amplifier, responsive to a multiplexer control signal to connect the local input/output lines to the global input/output lines; and
a controller for activating the local sense control signal within a predetermined duration in response to a first signal and a second signal,
wherein the controller is operable to activate the local sense amplifier for a period commensurate an activation of a column select signal.

* * * * *